(12) United States Patent
Thibedeau et al.

(10) Patent No.: US 11,286,840 B2
(45) Date of Patent: Mar. 29, 2022

(54) FAN SHROUD

(71) Applicant: Hoffman Enclosures, Inc., Anoka, MN (US)

(72) Inventors: Jeffrey Thibedeau, Robbinsdale, MN (US); Seng Chang, Minneapolis, MN (US); Michael Koehler, Ramsey, MN (US)

(73) Assignee: Hoffman Enclosures, Inc., Anokoa, MN (US)

( * ) Notice: Subject to any disclaimer, the term of this patent is extended or adjusted under 35 U.S.C. 154(b) by 383 days.

(21) Appl. No.: 16/251,450

(22) Filed: Jan. 18, 2019

(65) Prior Publication Data

US 2019/0226385 A1      Jul. 25, 2019

Related U.S. Application Data

(60) Provisional application No. 62/619,432, filed on Jan. 19, 2018.

(51) Int. Cl.
*F01P 5/06* (2006.01)
*F04D 29/54* (2006.01)
(Continued)

(52) U.S. Cl.
CPC .............. *F01P 5/06* (2013.01); *F04D 29/541* (2013.01); *H05K 7/20172* (2013.01);
(Continued)

(58) Field of Classification Search
CPC combination set(s) only.
See application file for complete search history.

(56) References Cited

U.S. PATENT DOCUMENTS 4,177,720 A * 12/1979 Schmidt .............. A47J 37/0763
99/419
4,717,216 A     1/1988 Hornak
(Continued)

FOREIGN PATENT DOCUMENTS

CA     2495608 A1    8/2005
EP     0924454 A1 *  6/1999  ............. F16M 13/02
(Continued)

OTHER PUBLICATIONS

Guardian/GuardianX Series Indoor/Outdoor Filter Fans; obtained from the internet;<https://www.kooltronic.com/fa-guardian-filter-fans.aspx>; Mar. 26, 2019; 3 pages.
(Continued)

*Primary Examiner* — Steven S Anderson, II
(74) *Attorney, Agent, or Firm* — Quarles & Brady LLP

(57) ABSTRACT

A shroud assembly can include a support frame with a locking slot and a hinge slot, and a shroud with a first pin and a second pin. The locking slot can receive the first pin to secure the shroud in a closed configuration. The hinge slot can receive the second pin to support the shroud in the closed configuration, in an open configuration, and during hinging of the shroud between the closed and open configurations. A tab can engage a notch to support the shroud at a predetermined angle relative to the support frame when the shroud is in the open configuration.

20 Claims, 12 Drawing Sheets

(51) Int. Cl.
*H05K 7/20* (2006.01)
*F28F 9/00* (2006.01)

(52) U.S. Cl.
CPC ...... *H05K 7/20181* (2013.01); *F01P 2070/50* (2013.01); *F28F 9/002* (2013.01)

(56) References Cited

U.S. PATENT DOCUMENTS

| | | |
|---|---|---|
| 5,045,640 A | 9/1991 | Riceman |
| 5,076,455 A | 12/1991 | Begley |
| 5,189,597 A | 2/1993 | Mayer et al. |
| 5,228,584 A | 7/1993 | Williams, Jr. |
| 5,317,108 A | 5/1994 | Prairie, Jr. |
| 5,358,135 A | 10/1994 | Robbins et al. |
| 5,456,377 A | 10/1995 | Williams, Jr. |
| 5,533,637 A | 7/1996 | Williams, Jr. |
| 5,564,592 A | 10/1996 | Martin et al. |
| 6,392,140 B1 | 5/2002 | Yee et al. |
| 6,526,773 B1 | 3/2003 | Cho |
| 6,639,796 B2 | 10/2003 | Cannon |
| 6,730,845 B1 | 5/2004 | Criniti et al. |
| 6,826,048 B1 | 11/2004 | Dean et al. |
| 7,035,102 B2 | 4/2006 | Holmes et al. |
| 7,242,576 B2 | 7/2007 | Coster et al. |
| 7,248,476 B2 | 7/2007 | Holmes et al. |
| 7,277,277 B2 | 10/2007 | Bang |
| 7,466,547 B2 | 12/2008 | Holmes et al. |
| 7,684,192 B2 | 3/2010 | Holmes et al. |
| 7,848,105 B2 | 12/2010 | Holmes et al. |
| 8,425,286 B2 | 4/2013 | Coster et al. |
| 8,503,177 B2 | 8/2013 | Chiu |
| 8,827,778 B2 | 9/2014 | Hartmann |
| 9,207,724 B2 | 12/2015 | Coster et al. |
| 9,893,504 B2 | 2/2018 | Huang |
| 2005/0007747 A1 | 1/2005 | Axelrod |
| 2005/0138944 A1* | 6/2005 | Gwin .................. H05K 7/20172 62/259.2 |
| 2005/0138994 A1 | 6/2005 | Gwin et al. |
| 2012/0147548 A1* | 6/2012 | Lin .......................... G06F 1/187 361/679.31 |
| 2013/0033159 A1 | 2/2013 | Immel et al. |

FOREIGN PATENT DOCUMENTS

| | | |
|---|---|---|
| EP | 0924454 A1 | 6/1999 |
| EP | 1276191 B1 | 4/2012 |

OTHER PUBLICATIONS

ICEqube Cooling Solutions; Washdown Filtered Fans (FPW); Copyright 2018 Ice Qube, Inc.—All Rights Reserved; 3 pages.

Rittal—The System.; Hose-proof hood to increase the protection category; Friedhelm LOH Group; 1 page.

* cited by examiner

FAN SHROUD

CROSS-REFERENCE TO RELATED APPLICATIONS

This application claims priority to U.S. Provisional Patent Application No. 62/619,432, titled "Fan Shroud" and filed Jan. 19, 2018, the entirety of which is incorporated herein by reference.

BACKGROUND

Fan assemblies can be used to provide cooling airflow or other ventilation for electrical enclosures and other installations. In some cases, it may be useful to provide a shroud to cover a fan assembly. In some cases, it may be useful to provide a fan shroud on an exterior of an enclosure, with the shroud configured to selectively provide access to the fan assembly.

SUMMARY

Some embodiments of the invention provide a shroud assembly for use with an enclosure. A support frame can include at least one side wall with a locking slot, a hinge slot, and a notch. A shroud can include a first pin, a second pin, and a tab. The locking slot can be configured to receive the first pin to secure the shroud in a closed configuration. The hinge slot can be configured to receive the second pin to support the shroud in the closed configuration, in an open configuration, and during hinging of the shroud between the closed and open configurations. The tab can be configured to engage the notch to support the shroud at a predetermined angle relative to the support frame when the shroud is in the open configuration.

Some embodiments of the invention provide a support frame for a shroud assembly for use with an enclosure, with the shroud assembly including a shroud a first pin, a second pin, and a tab. A side wall of the support frame can include a locking slot, a serpentine hinge slot, and a notch. The locking slot can be configured to receive the first pin to secure the shroud in a closed configuration and to release the first pin for the shroud to move to an open configuration. The serpentine hinge slot can be configured to receive the second pin to support the shroud in the closed configuration, in an open configuration, and during hinging of the shroud between the closed and open configurations. The notch can be configured to engage the tab to support the shroud at a predetermined angle relative to the support frame when the shroud is in the open configuration.

Some embodiments of the invention provide shroud for a shroud assembly for use with an enclosure, with the shroud assembly including a support frame with a locking slot, a hinge slot, and a notch. The shroud can include a shroud body, a first pin, a second pin, and a tab. The first pin can be disposed to be received in the locking slot to secure the shroud in a closed configuration. The second pin can be disposed to be received in the hinge slot to support the shroud in the closed configuration, in an open configuration, and during hinging of the shroud between the closed and open configurations. The tab can be configured to engage the notch to support the shroud at a predetermined angle relative to the support frame when the shroud is in the open configuration.

BRIEF DESCRIPTION OF THE DRAWINGS

The accompanying drawings, which are incorporated in and form a part of this specification, illustrate embodiments of the invention and, together with the description, serve to explain the principles of embodiments of the invention.

DETAILED DESCRIPTION

Figure 1:
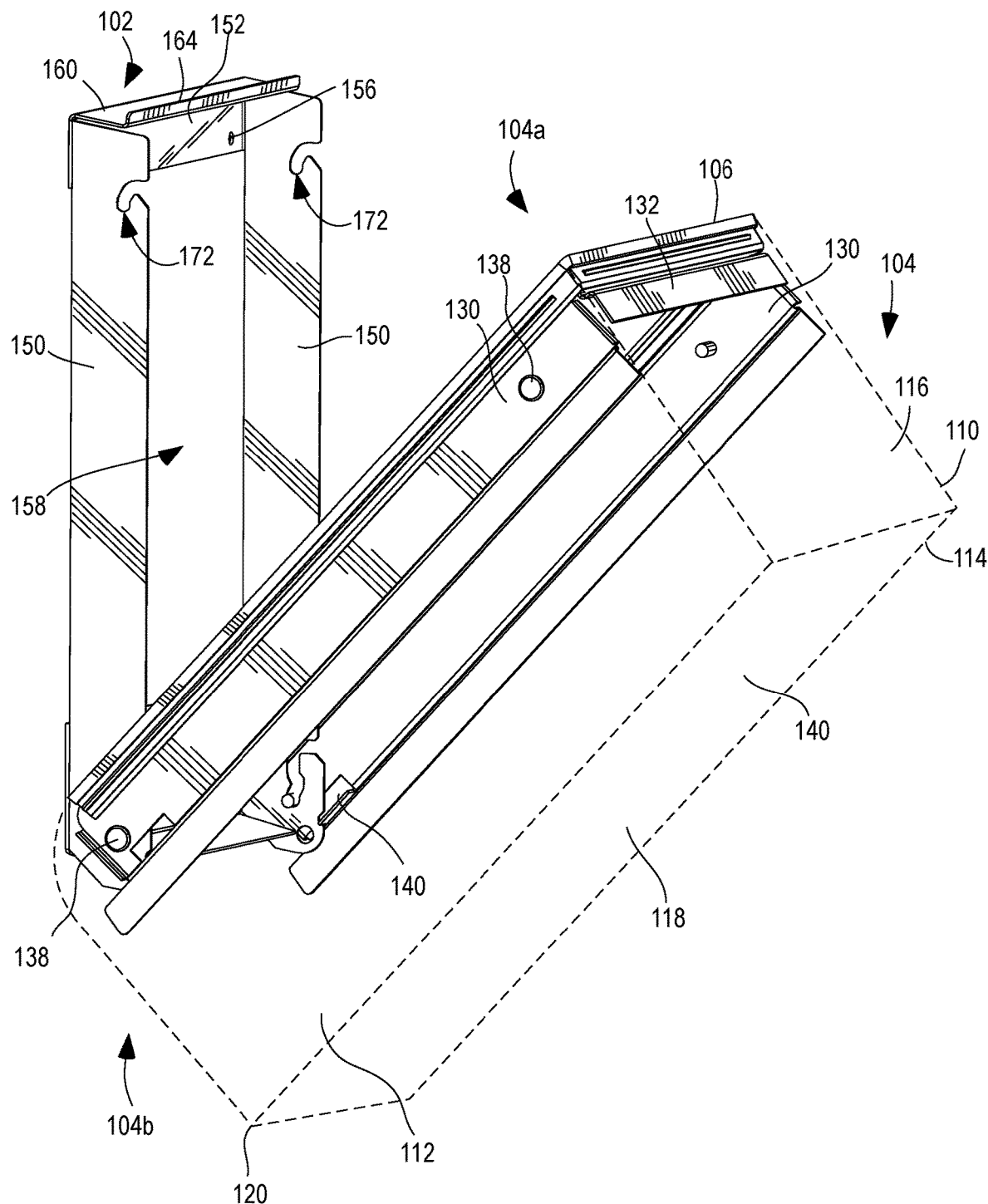
FIGS. 1 and 2 are isometric views of a shroud assembly according to an embodiment of the invention, in an open configuration.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Likewise, the phrases "at least one of A, B, and C," "one or more of A, B, and C," and the like, are meant to indicate A, or B, or C, or any combination of A, B, and/or C. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

As also noted above, it may be useful to provide shrouds for fan openings or other features of enclosures. Embodiments of the invention can provide shroud assemblies (and components thereof) that can be readily installed on a variety of enclosures. Further, shrouds of some embodiments can be easily installed without requiring specialized tools or training, and can hinge open to allow access to otherwise protected components. In some embodiments, shrouds according to the invention can be configured to open only to a predetermined angle before being automatically stopped.

Figure 2:
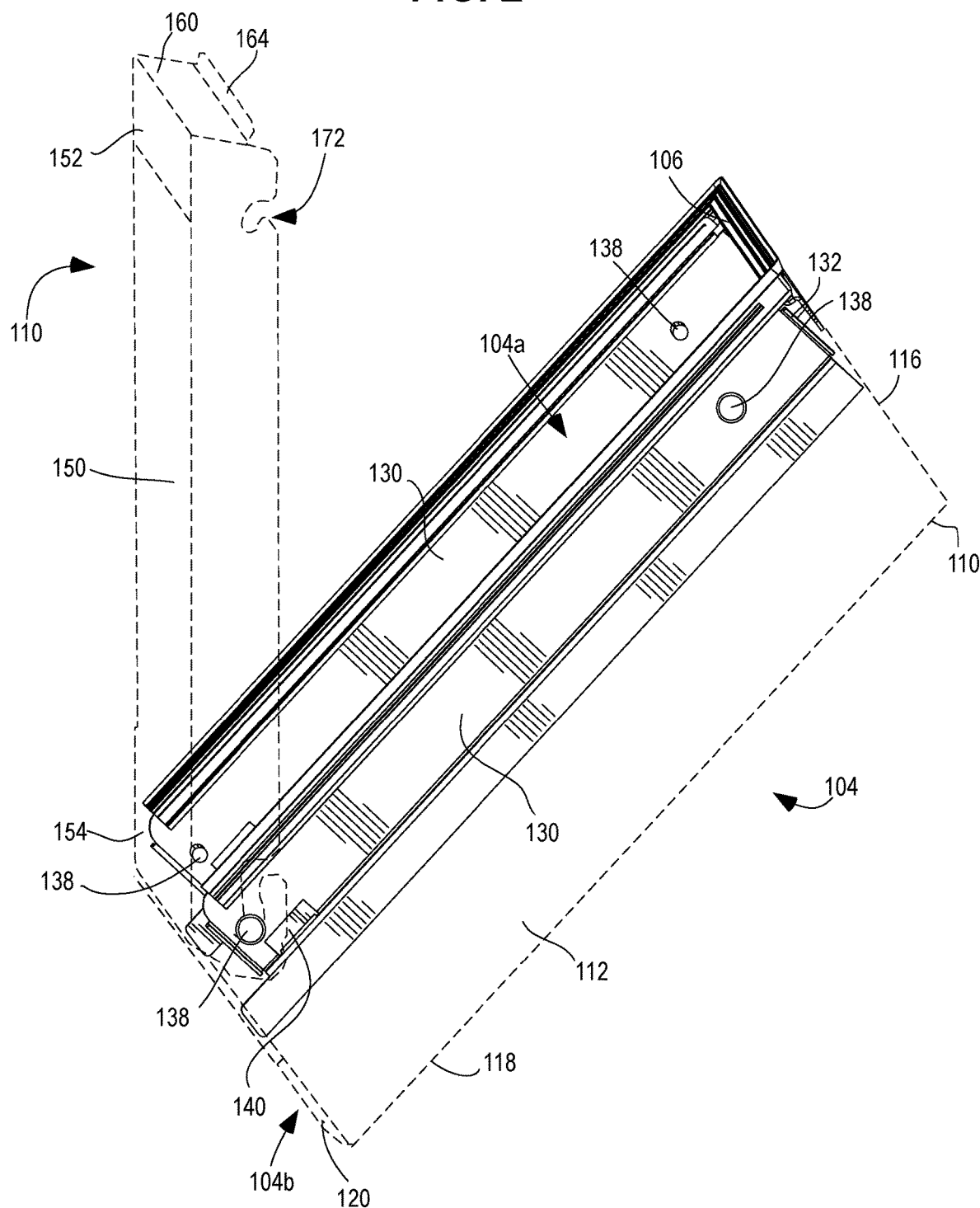
Figure 3:
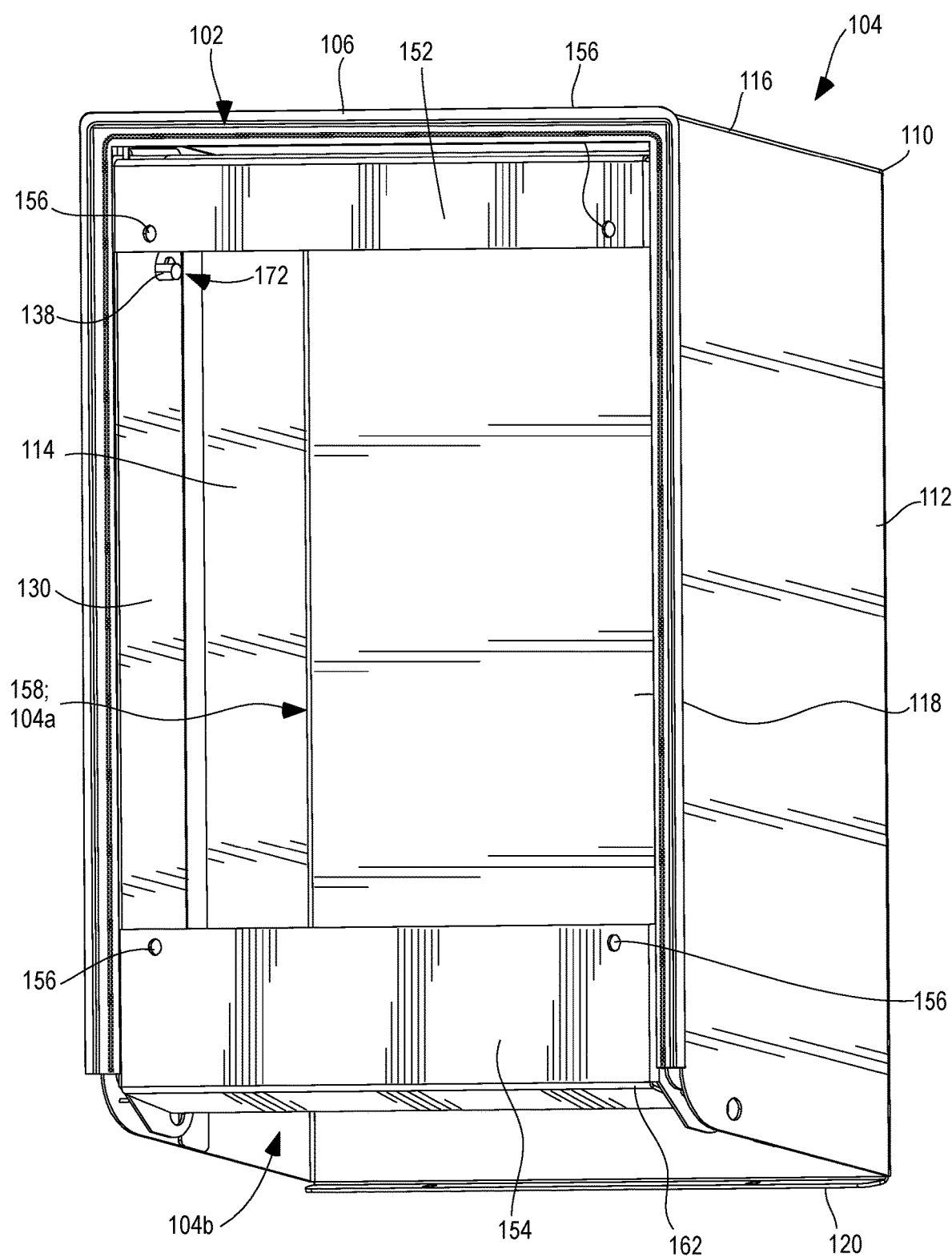
FIG. 3 is an isometric view of the shroud assembly of FIGS. 1 and 2 in a closed configuration.

FIGS. 1 through 3 illustrate a fan shroud assembly 100 according to an embodiment of the invention. The fan shroud assembly 100 is configured to be selectively swung open for access to a fan assembly (not shown) or other equipment, and swung closed to protect the fan assembly from environmental factors such as water, dust, and debris. Generally, the fan shroud assembly 100 includes a support frame 102 and a shroud 104. The support frame 102 is configured to be secured to an enclosure and the shroud 104 is configured to be supported by the support frame 102. The fan shroud assembly 100 is shown in an example open configuration in FIGS. 1 and 2, and in an example closed configuration in FIG. 3.

Fan shrouds according to the invention can be configured for use with a variety of fan assemblies. For example, in some arrangements, the fan shroud assembly 100 can be installed to shield a filter fan assembly, as may be useful to prevent excessive fouling or wetting of a filter, as well as to generally prevent unwanted ingress of substances into the relevant enclosure. In other embodiments other configurations are possible. Further, in some embodiments, shrouds or support frames may be differently configured than the shroud 104 or the support frame 102. For example, other support frames may exhibit differently shaped or sized internal openings or other features, and other shrouds may exhibit different external profiles, differently sized or located openings, and so on.

In some embodiments, a gasket arrangement or other sealing element can be provided in order to further assist in protecting the relevant fan assembly. As illustrated in FIGS. 1 through 3, for example, the shroud 104 supports a single-piece gasket 106 that extends along the top and both vertical sides of the shroud 104 at an open back 104a of the shroud 104. Thus arranged, the gasket 106 can seal against an enclosure when the fan shroud assembly 100 is closed (e.g., as in FIG. 3). In other embodiments, other arrangements are possible, including arrangements with multiple-piece gaskets, other sealing elements, or no sealing elements.

As also noted above, different shrouds according to the invention can exhibit different arrangements of openings. As shown in FIG. 3 in particular, for example, the shroud 104 provides a generally enclosed area when closed, but exhibits an open bottom 104b as well as the open back 104a. This may be useful, for example, in order to provide a relatively unobstructed flow path for air to move to or from the fan assembly (not shown), while still generally shielding the fan assembly from the environment. In other embodiments, other flow paths may be provided. For example, in some embodiments, louvers or other semi-open features can be provided on the sides, top, or front of the shroud 104, as appropriate. Similarly, in some embodiments, the bottom of the shroud 104 may be partially or fully closed.

Figure 4:
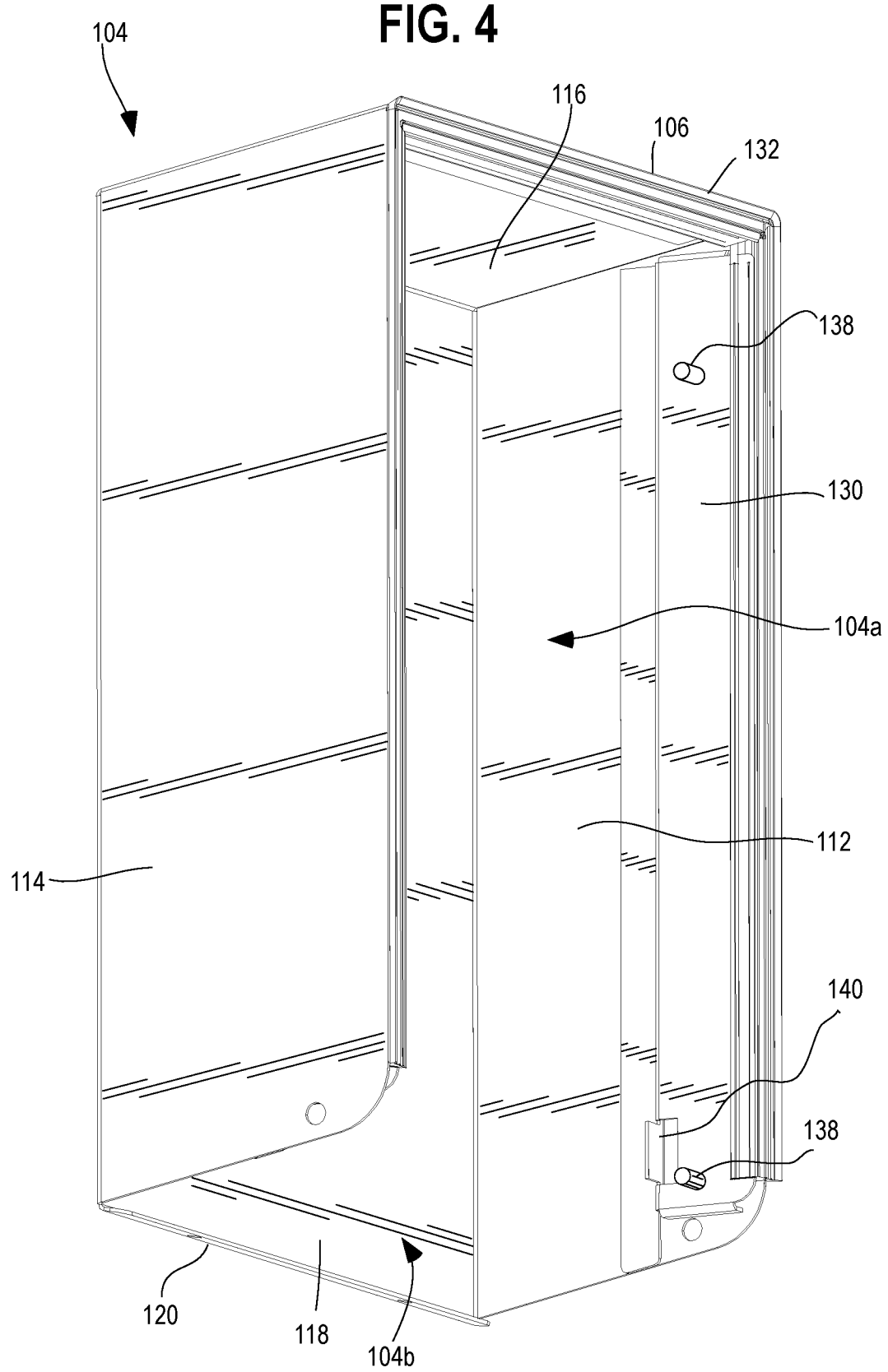
FIGS. 4 and 5 are isometric views of a shroud for use with the shroud assembly of FIGS. 1 and 2.

In some embodiments, a body of a shroud can be formed from a single piece of material. For example, as illustrated in FIG. 4 in particular, a body 110 of the shroud 104 includes side walls 112, 114, a top wall 116, a front wall 118, and a bottom flange 120 that can be integrally formed from a single piece of sheet metal or other material. In some embodiments, seams of the body 110 can be welded or otherwise joined in order to provide air- or water-tight joints. In some embodiments, multiple pieces of material can be used to form a body of a shroud or various other components.

In the embodiment illustrated, the body 110 is generally rectangular, with generally right angles at the various seams. Similarly, in the embodiment illustrated, the front wall 118 is slightly longer than the open back 104a, as reflected in the slightly downward angle of the bottom edges of the side walls 112, 114. In other embodiments, other arrangements are possible.

In some embodiments, additional components can be secured to a shroud, such as may help to secure the shroud to a support structure, allow prescribed (or other) movement of the shroud, or secure components (e.g., gaskets) to the shroud. As illustrated in FIGS. 5 through 8, for the shroud 104, for example, a set of brackets 130 are secured (e.g., welded) to the interior of the side walls 112, 114 of the body 110, and a bracket 132 is secured (e.g., welded) to the interior of the top wall 116. The brackets 130, 132 can be formed from sheet metal, similarly to the body 110, or from other material, as appropriate.

Figure 7:
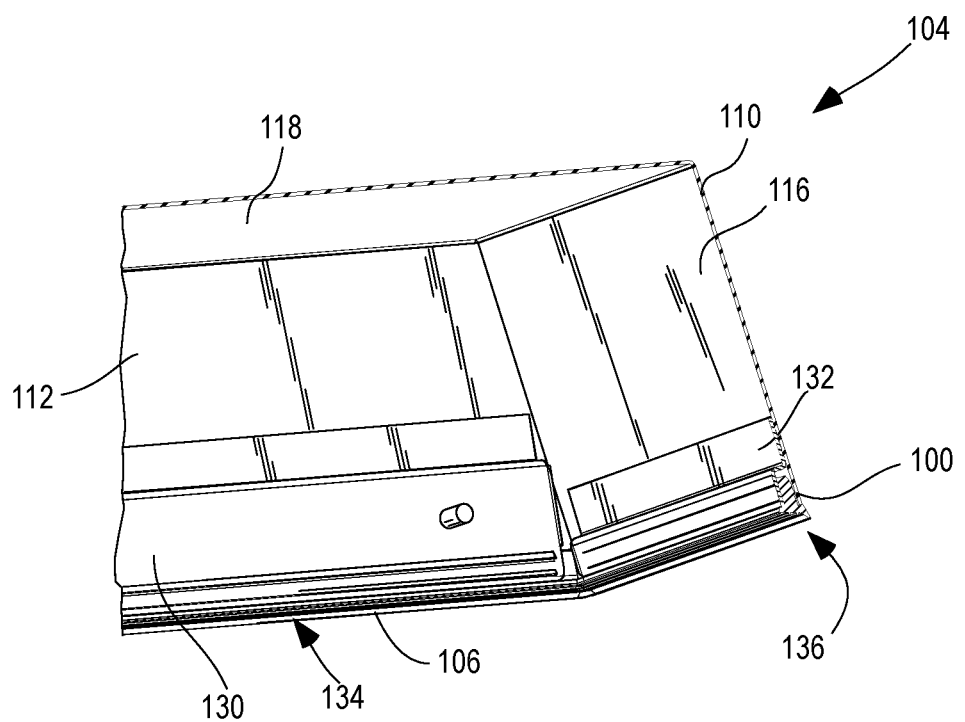
FIG. 7 is a sectional partial views of the shroud of FIGS. 4 and 5, with a gasket installed.
Figure 8:
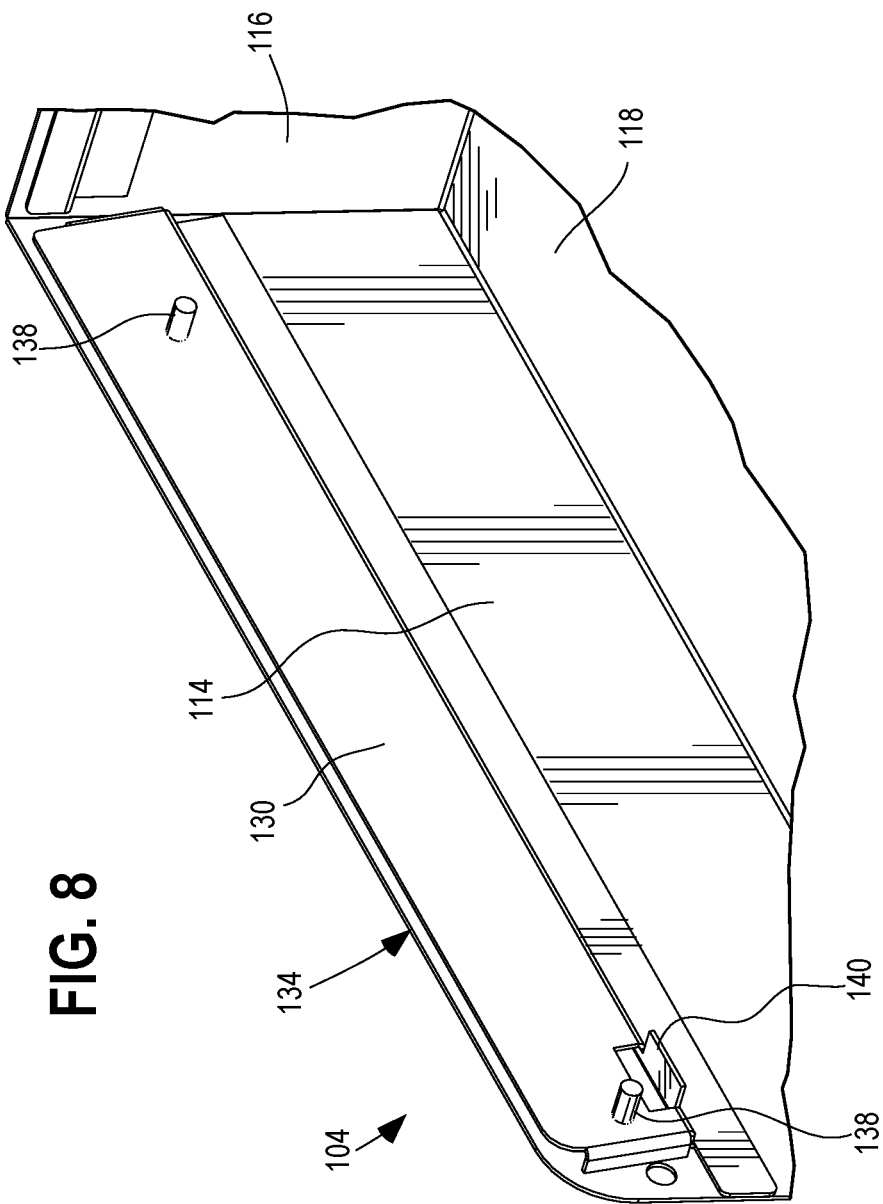
FIG. 8 is an isometric partial view of the shroud of FIGS. 4 and 5, without a gasket installed.

In the embodiment illustrated, the brackets 130, 132 can be used to secure the gasket 106 to the body 110. As illustrated in FIG. 7 in particular, each of the brackets 130 (only one shown in FIG. 7) include an offset portion that defines a channel 134 between each of the brackets 130 and the respective side wall 112, 114. In some cases, including as illustrated, part of a flange of the gasket 106, or another similar feature, can be inserted into the channel 134 in order to secure the gasket 106 (or other component) to the body 110. Similarly, as illustrated in FIG. 8 in particular, the bracket 132 includes an offset portion that defines a channel 136 between the bracket 132 and the top wall 116. As with the channels 134, the flange of the gasket 106, or another similar feature, can be inserted into the channel 136 to further secure the gasket 106 to the body 110.

In the illustrated embodiment, the channels 134, 136, as defined by the brackets 130, 132, extend to closely proximal ends, such that a continuous gasket can extend through all three of the channels 134, 136 while being substantially supported by the brackets 130, 132 and the shroud body 110. This substantial support for a continuous gasket can be useful, for example, in order to help ensure appropriately continuous and reliable sealing around substantially the entire side and top perimeters of the shroud body 110.

Figure 5:
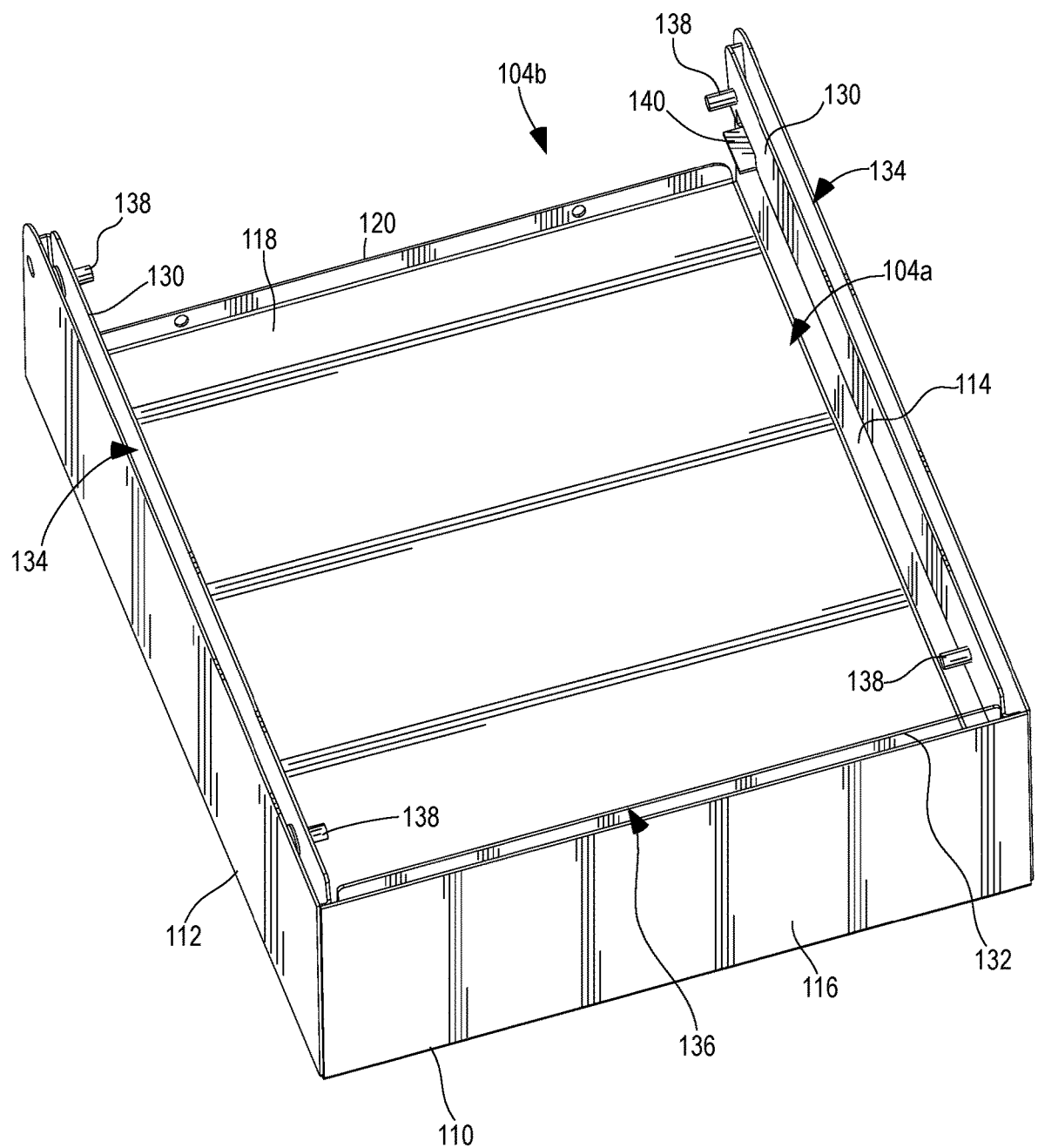
Figure 6:
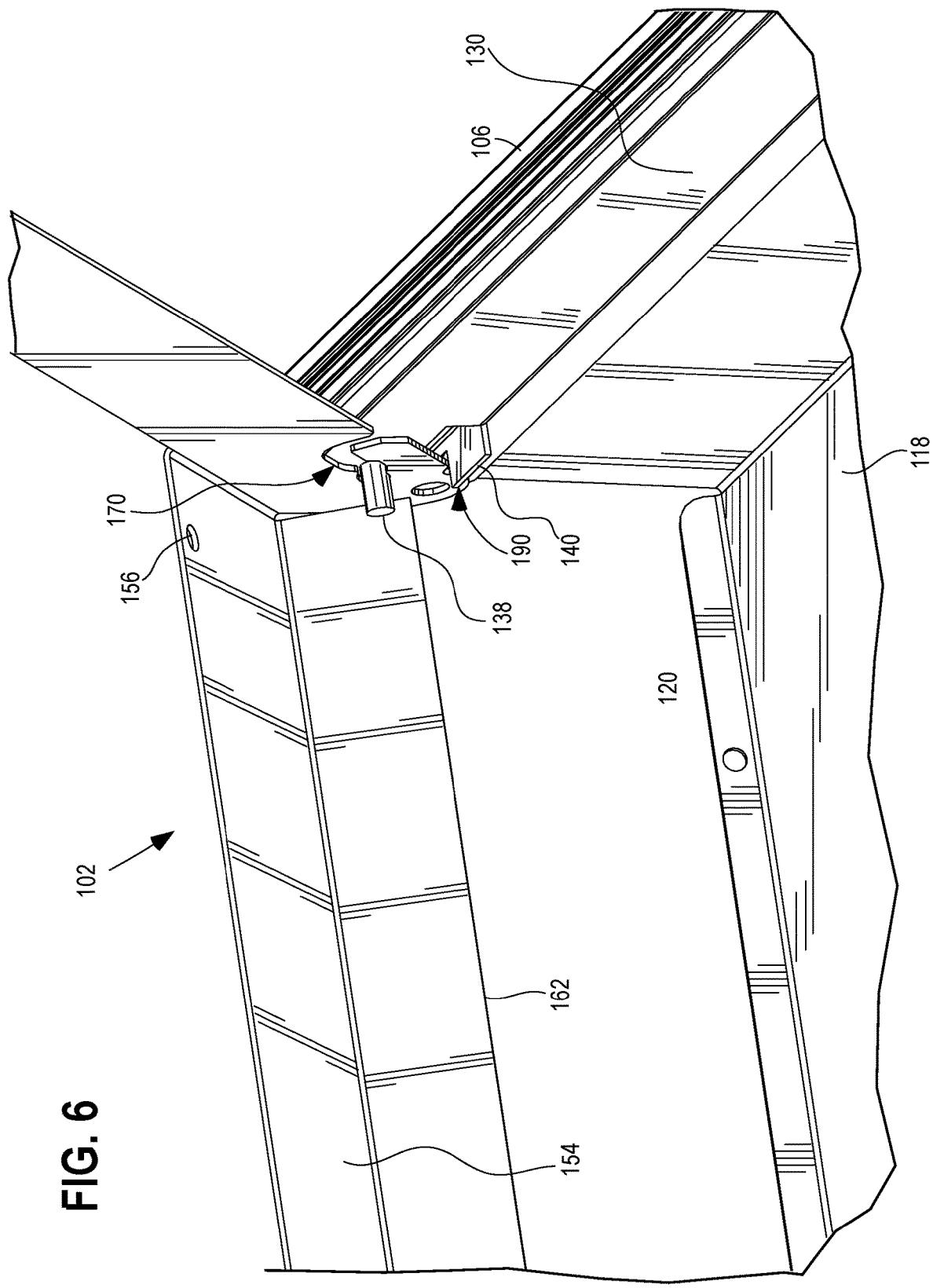
FIG. 6 is an isometric partial view of the shroud assembly of FIGS. 1 and 2, in the open configuration.

In some embodiments, brackets secured to a shroud body can be used for other purposes than (or in addition to) securing a sealing element. For example, the brackets 130, 132 or other components secured to the body 110 can provide features to secure the body 110 to the support frame 102 (see, e.g., FIGS. 1 and 2). As illustrated in FIGS. 5 and 6 in particular, for example, the brackets 130 includes sets of protrusions configured as welded or otherwise secured pins 138. As also described below, the pins 138 can be configured to engage corresponding features on the support frame 102 to hingedly secure the body 110, and the shroud 104 generally, to the support frame 102.

Figure 9:
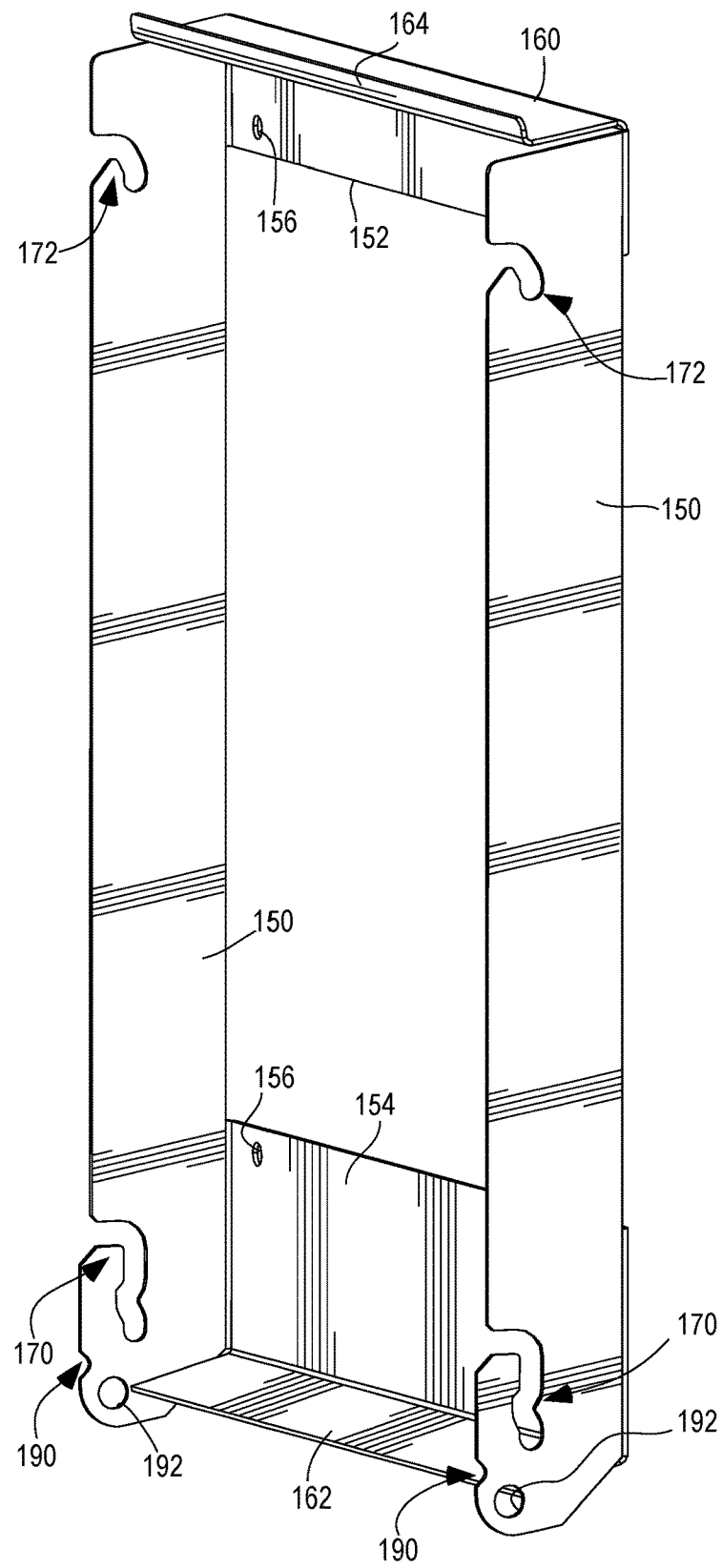
FIG. 9 is an isometric view of a support frame for use with the shroud assembly of FIGS. 1 and 2.

In some embodiments, other features can also be provided. For example, in the embodiment illustrated, each of the brackets 130 further includes a respective tab 140 towards a bottom end of the bracket 130. In the embodiment illustrated, as illustrated in FIG. 9 in particular, the tabs 140 can be integrally formed as folded-out portions of the brackets 130. In other embodiments, other configurations are possible. As also discussed below, the tabs 140 can help to support the shroud 104 in an open configuration, at a predetermined angle.

Figure 10:
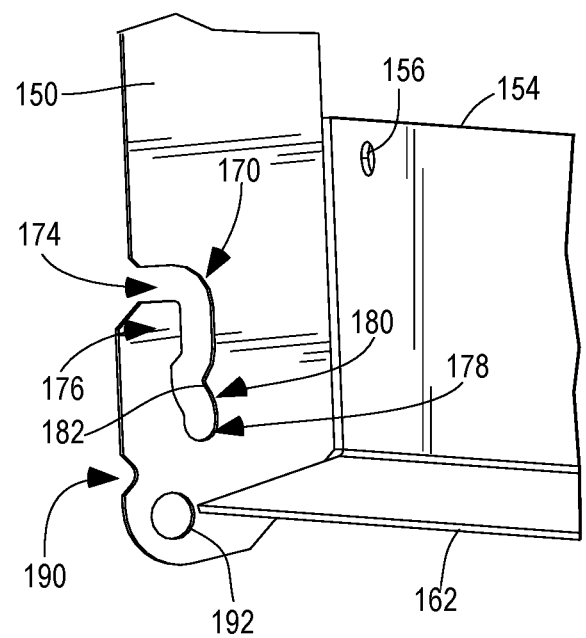
FIGS. 10 and 11 are isometric partial views of the support frame of FIG. 9.

Similarly to the shroud 104, the support frame 102 can also be formed from sheet metal or other appropriate material, using a single folder piece of metal or multiple pieces of metal joined (e.g., welded) together. As illustrated in FIG. 10 in particular, the support frame 102 is formed with two side walls 150 that are configured to extend at generally right angles relative to an enclosure wall (not shown) to which the shroud assembly 100 is mounted. Rear panels 152, 154 include mounting features such as mounting holes 156 to secure the support frame 102 to the enclosure. The rear panels 152, together with the side walls 150, also define a fan opening 158.

Top and bottom walls 160, 162 extending between the side walls 150 can provide structural rigidity to the support frame 102. The walls 160, 162 can also help to shield the relevant fan assembly, even when the shroud 104 is open. For example, in the embodiment illustrated, the top wall 160 includes an upturned flange 164 that can help to direct water or other substances away from the fan opening 158.

Figure 11:
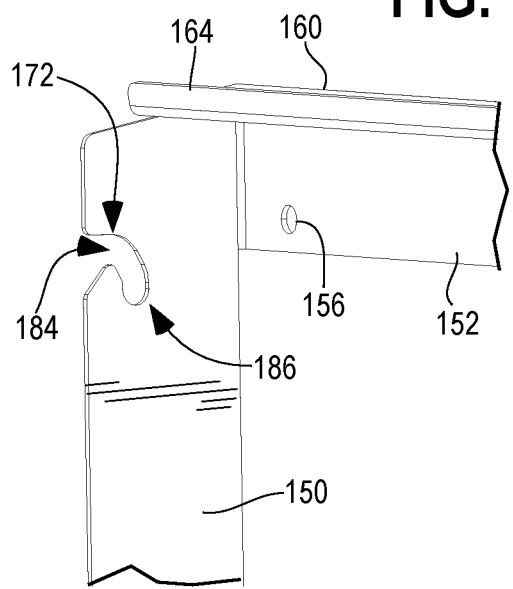
Figure 12:
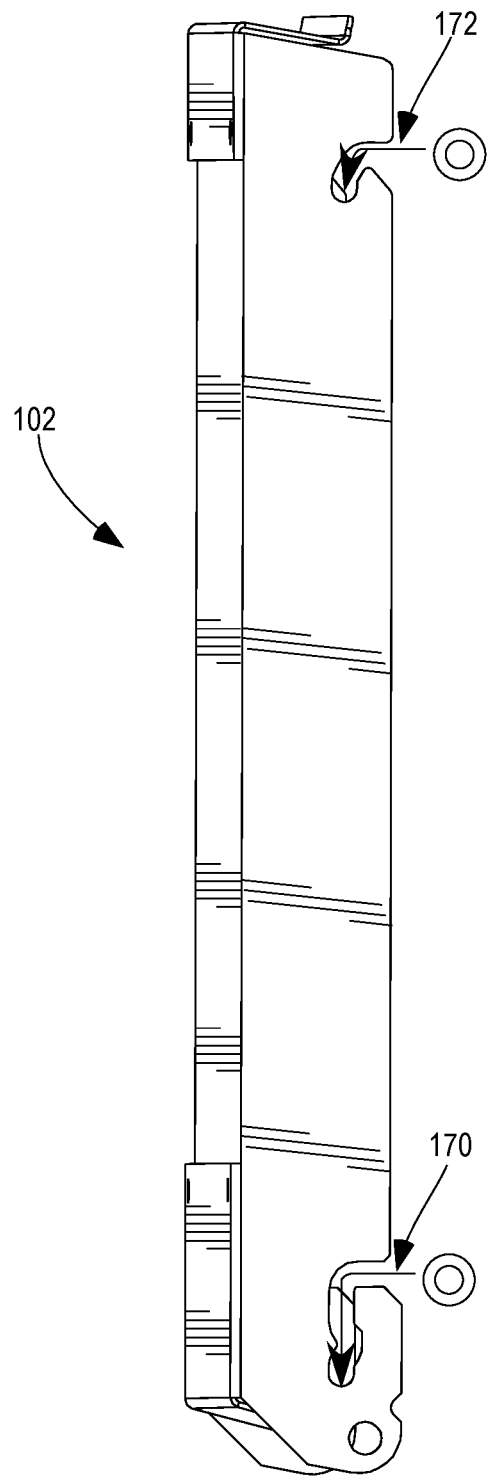
FIG. 12 is an isometric view of the support frame of FIG. 9, illustrating aspects of an assembly process for the shroud assembly of FIGS. 1 and 2.

Generally, support structures according to the invention can include slots to receive corresponding protrusions on an associated shroud. In order to appropriately support the shroud 104, for example, each of the side walls 150 includes a hinge slot 170 and a locking slot 172. As illustrated in FIG. 11 in particular, the hinge slot 170 is somewhat longer than the locking slot 172 and is generally serpentine, with an entrance that includes a substantially horizontal portion 174 and a substantially vertical portion 176. The locking slot 172 also includes a pin seat 178, and an offset retention portion 180 that curves away from the vertical portion 176 and then back towards the pin seat 178 to define a retention protrusion 182. As illustrated in FIG. 12 in particular, the locking slot 172 includes a flared entrance portion 184 with a narrowed locking portion 186.

As illustrated in FIG. 12 in particular, the hinge slot 170 and the locking slot 172 of each of the side walls 150 can receive the corresponding pin 138 on the shroud 104. With the pins thus received, the weight of the shroud 104 can thereby help to secure the pins 138 within the slots 170, 172 and, correspondingly, help to secure the shroud 104 to the support frame 102 and to the enclosure.

To hinge the shroud 104 open, the shroud 104 can then be lifted slightly, so that the upper set of the pins 138 are aligned with the flared entrance portions 184 of the locking slots 172 (i.e., are clear of a protrusion that defines the top of the locking portion 186). With the pins 138 thus aligned, the shroud 104 can then be pivoted about the lower pins 138 to an open configuration (see, e.g., FIGS. 1 and 2). To return the shroud 104 to the closed configuration, the shroud 104 can then be pivoted about the lower pins 138 back towards the shroud 104 until the upper pins 138 re-enter the locking slots 172 and the shroud 104 is correspondingly secured in the closed configuration.

In some embodiments, the configuration of locking and hinge slots can assist users in appropriately opening and closing a shroud assembly. For example, the offset retention portions 180 of the hinge slots 170, including the retention protrusions 182, can engage the lower pins 138 to usefully provide resistance to any lifting of the shroud 104 beyond that which is necessary to remove the upper pins 138 from the locking slots 172. Accordingly, for example, users can be provided with tactile feedback to help avoid inadvertent removal of the shroud 104 from the support frame 102, including as the shroud 104 is lifted out of the locking slots 172 to be hinged open.

Similarly, the flared configuration of the entrance portions 184 of the locking slots 172 can help to automatically lift the shroud 104 to guide the upper pins 138 into the locking slots 172 as the shroud 104 is hinged closed. Accordingly, for example, users can simply swing the shroud 104 closed, with the flared entrance portions 184 providing any necessary lifting of the shroud 104 so that the upper pins 138 can be aligned to enter the locking slots 172. Further, as the shroud 104 is thus lifted, the offset retention portions 180 of the hinge slots 170 can help to prevent the shroud 104 from being lifted excessively, such that the shroud 104 can be easily moved to a closed configuration without requiring significant attention or care from users.

In some embodiments, the configuration of a locking slot can assist users in separating a sealing element from an enclosure (i.e., in breaking a seal) with relative ease and without causing excessive wear on the seal. For example, as the shroud 104 is moved from a fully seated, fully closed configuration, the outwardly directed portion of the offset retention portion 180 of the hinge slots 170 can direct the corresponding pins 138 to move slightly outwardly, away from the relevant enclosure. Correspondingly, the shroud body 110 can be moved outwardly away from the enclosure, thereby effectively separating the gasket 106 from the enclosure. In some cases, this assisted breaking of a seal can result in substantially easier operation of the shroud assembly 100 than might otherwise be obtained.

In some embodiments, other features can be included. As illustrated in FIGS. 10 and 11, for example, a notch 190 and a hole 192 are provided in a lower portion of each of the side walls 150 of the support frame 102, somewhat below the bottom ends of the pin seats 178. In some embodiments, the holes 192 can be used to secure the shroud assembly 100 in a closed configuration. For example, a padlock or other securing device can be locked through one or both of the holes 192, in engagement with a corresponding feature or features on the shroud 104, such as a hole in either of the side walls 112, 114 (see, e.g., FIG. 8), in order to prevent the shroud 104 from being hinged away from the support frame 102.

Figure 13:
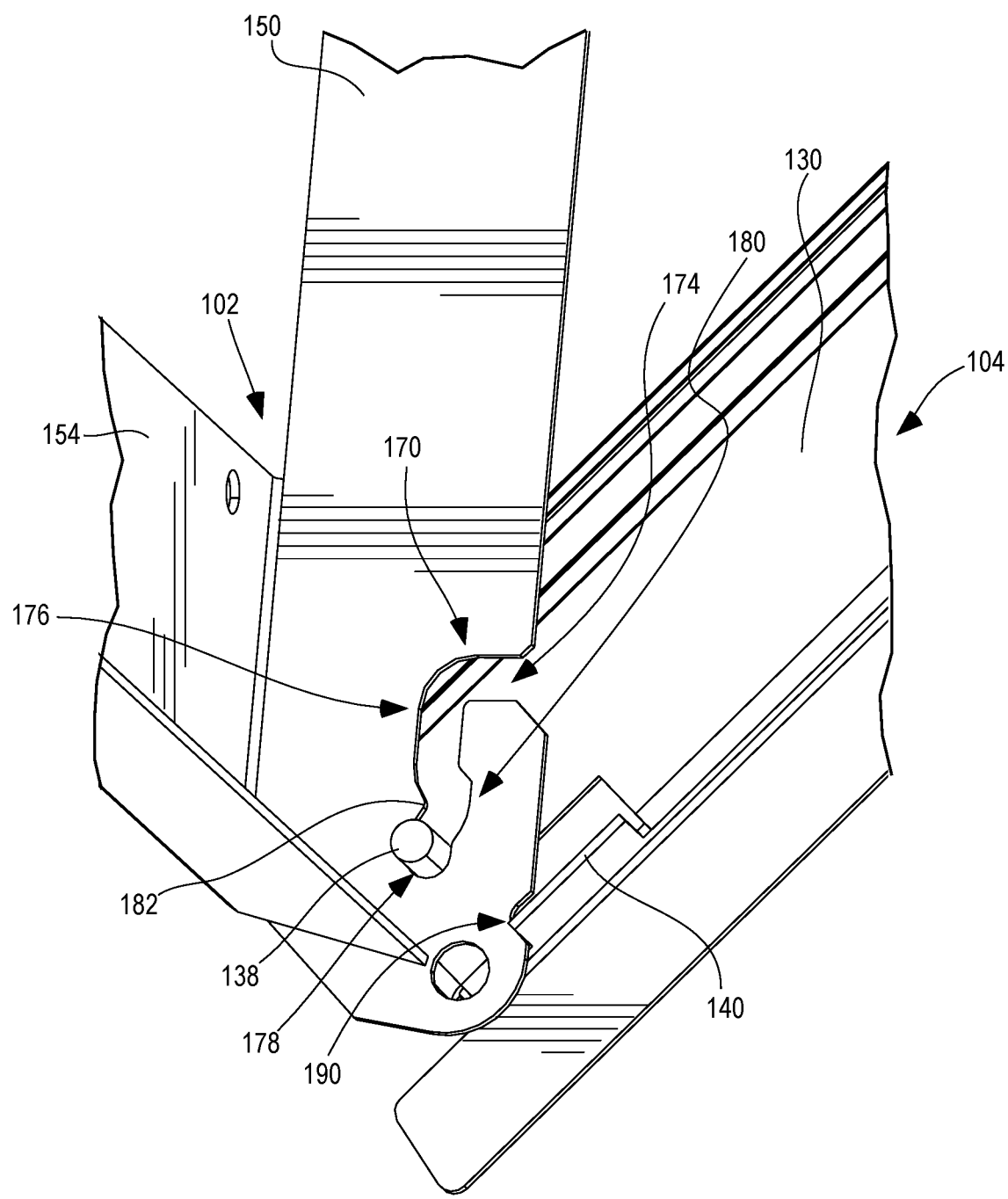
FIG. 13 is an isometric partial view of the shroud assembly of FIGS. 1 and 2, in the open configuration.

In some embodiments, the notch 190 can help to secure the shroud 104 in a desired open orientation. As illustrated in FIG. 13 in particular, when the shroud 104 is hinged open to a predetermined angle relative to the support frame 102, and the enclosure in general, the tabs 140 on the brackets 130 can engage the side walls 150 at the notches 190 in order to stop the shroud 104 at the predetermined angle. As also illustrated in FIGS. 1 and 2, in the embodiment illustrated, the notches 190 and the tabs 140 are configured to stop the shroud 104 when the shroud 104 is disposed at an angle of about 45 degrees relative to vertical. In other embodiments, other angles are possible. In some embodiments, one or more notches can allow for multiple or customizable angles. In some embodiments, a notch and a corresponding tab can be provided on other features, such as on a shroud and a support frame, respectively.

In some embodiments, notches and tabs, such as the notches 190 and the tabs 140, can help to secure a shroud at a predetermined angle without requiring a reorientation of the shroud from its hinging path. For example, in contrast to various conventional arrangements, the notches 190 and the tabs 140 can arrest the movement of the shroud 104 as the shroud 104 pivots, without, for example, requiring the pins 138 to slide to "holding" or "locking" positions. As with other features disclosed herein, this can contribute to simpler, more reliable, and more generally useful operation of some embodiments.

Thus, embodiments of the disclosure provide for an improved shroud assembly, as may be used with filter fan assemblies or other assemblies of various enclosures. In some embodiments, for example, a generally removable shroud can be configured to securely seal around an open portion of the shroud, and to be hinged open relative to a fixed support frame. Further, in some embodiments, a support frame can be configured to support a shroud at a predetermined open angle.

The previous description of the disclosed embodiments is provided to enable any person skilled in the art to make or use the invention. Various modifications to these embodiments will be readily apparent to those skilled in the art, and the generic principles defined herein may be applied to other embodiments without departing from the spirit or scope of the invention. Thus, the invention is not intended to be limited to the embodiments shown herein but is to be accorded the widest scope consistent with the principles and novel features disclosed herein.

The invention claimed is:

1. A shroud assembly for use with an enclosure, the shroud assembly comprising:
a support frame with at least one side wall that includes a locking slot, a hinge slot, and a notch; and
a shroud with a first pin, a second pin, a tab, a shroud body, and a set of brackets secured to the shroud body, each of the brackets cooperating with the shroud body to define a respective channel between the bracket and the shroud body;
the locking slot being configured to receive the first pin to secure the shroud in a closed configuration;
the hinge slot being configured to receive the second pin to support the shroud in the closed configuration, in an open configuration, and during hinging of the shroud between the closed and open configurations; and
the tab being configured to engage the notch to support the shroud at a predetermined angle relative to the support frame when the shroud is in the open configuration.

2. The shroud assembly of claim 1, wherein the hinge slot is disposed below the locking slot and is longer than the locking slot.

3. The shroud assembly of claim 2, wherein the hinge slot is configured as a serpentine slot.

4. The shroud assembly of claim 3, wherein the hinge slot includes a pin seat to support the second pin during hinging of the shroud between the closed and open configurations, and includes an offset retention portion disposed above the pin seat.

5. The shroud assembly of claim 4, wherein the locking slot includes a flared entrance portion and a narrowed locking portion.

6. The shroud assembly of claim 5, wherein the flared entrance portion is configured to engage the first pin to lift the shroud as the shroud is hinged towards the closed configuration.

7. The shroud assembly of claim 6, wherein the offset retention portion of the hinge slot is configured to engage the second pin as the flared entrance portion lifts the shroud, to retain the second pin within the hinge slot.

8. The shroud assembly of claim 1, wherein the tab is a first tab, the notch is a first notch, and wherein at least one of:
the notch being positioned below the hinge slot; or
the at least one side wall of the shroud including a second tab that is configured to engage a second notch of the support frame to support the shroud at the predetermined angle relative to the support frame when the shroud is in the open configuration.

9. The shroud assembly of claim 1, further comprising:
a gasket seated in the channels that are defined by the brackets and the shroud body.

10. The shroud assembly of claim 9, wherein the gasket includes a single-piece gasket.

11. The shroud assembly of claim 1, wherein the first and second pins are secured to at least one of the brackets.

12. The shroud assembly of claim 1, wherein the notch is disposed below the hinge slot.

13. The shroud assembly of claim 1, wherein the shroud is configured to pivot open to engage the notch with the tab, to support the shroud at the predetermined angle relative to the support frame without the second pin sliding within the hinge slot.

14. A shroud assembly for use with an enclosure that includes a wall with a fan opening, the shroud assembly comprising:
a shroud comprising:
a shroud body;
a set of brackets secured to the shroud body, each of the brackets cooperating with the shroud body to define a respective channel between the bracket and the shroud body;
a first pin;
a second pin; and
a support frame comprising:
a side wall that is configured to be secured to the wall of the enclosure at the fan opening, the side wall including:
a locking slot; and
a serpentine hinge slot;
the locking slot being configured to receive the first pin to secure the shroud in a closed configuration and to release the first pin for the shroud to move to an open configuration; and
the serpentine hinge slot being configured to receive the second pin to support the shroud in the closed configuration, in the open configuration, and during hinging of the shroud between the closed and open configurations.

15. The shroud assembly of claim 14, wherein at least one of the side wall and the shroud assembly further includes a notch;
wherein a different at least the other of the side wall and the shroud assembly includes a tab; and
wherein the notch is configured to engage the tab to support the shroud at a predetermined angle relative to the support frame when the shroud is pivoted to the open configuration.

16. The shroud assembly of claim 14, wherein the serpentine hinge slot includes a pin seat to support the second pin during hinging of the shroud between the closed and open configurations, and further includes an offset retention portion disposed above a pin seat.

17. The shroud assembly of claim 16, wherein the serpentine hinge slot further includes a substantially horizontal entrance portion, and a substantially vertical entrance portion between the substantially horizontal entrance portion and the pin seat.

18. The shroud assembly of claim 16, wherein the locking slot includes a flared entrance portion and a narrowed locking portion;

wherein the flared entrance portion is configured to engage the first pin to lift the shroud as the shroud is hinged towards the closed configuration; and wherein the offset retention portion of the serpentine hinge slot is configured to engage the second pin as the flared entrance portion lifts the shroud, to retain the second pin within the serpentine hinge slot.

19. A shroud for a shroud assembly for use with an enclosure, with the shroud assembly including a support frame with a locking slot, a hinge slot, and a notch, the shroud comprising:
- a shroud body;
- a set of brackets secured to the shroud body, each of the brackets cooperating with the shroud body to define a respective channel between the bracket and the shroud body;
- a first pin;
- a second pin; and
- a tab;

the first pin being disposed to be received in the locking slot to secure the shroud in a closed configuration;

the second pin being disposed to be received in the hinge slot to support the shroud in the closed configuration, in an open configuration, and during hinging of the shroud between the closed and open configurations; and the tab being configured to engage the notch to support the shroud at a predetermined angle relative to the support frame upon the shroud being pivoted to the open configuration.

20. The shroud of claim 19, wherein the tab is integrally formed with a bracket of the set of brackets;

wherein the first and second pins extend from the bracket, with the first pin disposed above the second pin and the second pin disposed above the tab; and wherein a gasket is received in the channel defined by the bracket.

* * * * *